United States Patent
Ma et al.

(10) Patent No.: US 6,654,427 B1
(45) Date of Patent: Nov. 25, 2003

(54) SIGNAL NOTCHING SYSTEM FOR LIMITING SIGNAL PEAKS

(75) Inventors: Zhengxiang Ma, Summit, NJ (US); Paul Anthony Polakos, Marlboro, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/363,329

(22) Filed: Jul. 28, 1999

(51) Int. Cl.[7] ............................................... H04L 25/03
(52) U.S. Cl. ........................................ 375/297; 375/296
(58) Field of Search ............................. 375/143, 146, 375/152, 295, 296, 297, 343, 350, 355; 332/123, 159

(56) References Cited

U.S. PATENT DOCUMENTS 5,287,387 A    2/1994   Birchler ........................ 375/60
5,519,890 A  * 5/1996   Pinckley ....................... 455/307
5,727,026 A  * 3/1998   Beukema ....................... 375/296
6,166,598 A  * 12/2000  Schlueter ...................... 330/127

* cited by examiner

*Primary Examiner*—Young T. Tse
(74) *Attorney, Agent, or Firm*—Julio A. Garceran

(57) ABSTRACT

A signal notching system reduces signal peaks by notching the peak of a signal above a threshold to produce a notched signal. The notched signal is then filtered to produce a resulting signal with a reduced peak amplitude. For example, in an implementation where the signal is represented by signal samples, the peak notching system first locates a peak sample that is beyond a threshold, such as a sample representing a positive peak sample of a peak above the threshold. Once a peak sample is located, the peak notching system adjusts the peak sample by an amount which is a function of the amount that the peak sample is beyond the threshold, effectively creating a notched signal with a one sample notch at the peak. The peak notching system filters the notched signal to fill in the notch to produce a signal with a reduced peak.

5 Claims, 4 Drawing Sheets

SIGNAL NOTCHING SYSTEM FOR LIMITING SIGNAL PEAKS

BACKGROUND OF THE INVENTION

1. Field of The Invention

This invention relates to communications systems, and more particularly to a system for reducing the peaks of a signal to be amplified.

2. Description of Related Art

An ideal power amplifier amplifies an input signal of a given bandwidth with no waveshape alteration. The ideal power amplifier is therefore characterized as having a transfer function (input signal vs. output signal) which is linear with no transfer function discontinuities. In practice, a power amplifier, however, has a transfer function with nonlinear and "linear" regions. Whether the power amplifier is operating in a linear or nonlinear region depends on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal peak amplitude causes the amplifier to saturate (no appreciable increase in output amplitude with an increase in input amplitude) or to shut-off (no appreciable decrease in output amplitude with a decrease in input amplitude), the amplifier is being overdriven, and the output signal is clipped or distorted. Generally, an amplifier is characterized as having a clipping threshold, and input signals having amplitudes beyond the clipping threshold are clipped at the amplifier output. In addition to distorting the signal, the clipping or nonlinear distortion of the input signal causes power to be generated in adjacent channels or frequencies to corrupt or interfere with signals in the adjacent channels or frequencies, commonly referred to as spectral regrowth or adjacent channel power (ACP). The generation of adjacent channel power is of particular concern in wireless communications systems where signals being amplified are in adjacent channels or frequency bands.

In communication systems where signals have a large range of amplitudes, components such as power amplifiers have to maintain linearity over a large dynamic range to avoid generating nonlinear distortion of the input signal and spectral adjacent channel power. For example in signals transmitted in the standard identified as EIA/TIA/IS-95 (Electronic Industries Association/Telecommunications Industry Association/Interim Standard 95) entitled "Mobile Station-Base Station Compatibility Standard for Dual-Mode Wideband Spread Spectrum Cellular System, Mar. 1993 ("IS-95"), the peak to average power ratio (PAR) for a single loaded code division multiple access (CDMA) 1.25 MHz carrier is about 11.3 dB measured at $10^{-4}$ peaking probability (indicating a 1/10,000 chance that a peak exceeds a threshold value for example of 8.5 dB above the average power). As such, a high cost, low efficiency power amplifier is operated at an average power level far below its saturation point to avoid distorting the peaks and generating ACP. To reduce the cost and improve the efficiency of the power amplifier and other components, methods have been proposed for reducing the PAR of the signal without generating significant ACP or spectral regrowth which occurs when power from the signal appears at different frequency bands.

A straight forward method for PAR reduction involves hardlimiting or hard clipping the signal peaks to a certain hardlimiting threshold to lower the PAR. A hard clipped signal, however, has abrupt edges and the short time duration of the clipped edges generates significant adjacent channel power and spectral regrowth in the frequency domain. A filter can be used to remove the ACP and the spectral regrowth. For a radio transmitter, the filter can be implemented at baseband or intermediate frequency (IF) where sharp filters are readily available either in digital or analog form. A digital implementation at baseband is favored because of its flexibility and low cost. It has been found, however, that after filtering the clipped signal, the signal peaks grow back. Accordingly, the peaks could be detected using the desired threshold, then the peaks above the detection threshold are hardlimited to a new limit lower than the detection threshold. When the peaks grow back after the cleanup filtering, they would still be below the targeted value. For digital hardware implementation, this method is as easy to implement as the simple hardlimiting. However, the peaks that are slightly above the threshold only needs to be clipped lightly and their growth after cleanup filtering is also small. By clipping all these peaks to the new limit, the peaks that are slightly above the threshold can be over-clipped.

U.S. Pat. No. 5,287,387 discloses a window clipping method for reducing the peak to average power ratio of an input signal. In the window clipping process, an attenuating window is centered about a local maximum of a signal peak above a threshold, and the attenuating window is multiplied with the input signal to generate an attenuated signal. The attenuating window is comprised of multiple sample weights which are valued at less than one. The multiple weights of the attenuating window are multiplied with corresponding peak samples of the input signal to reduce the peak of the input signal to below a threshold. However, multiplying the signals in the time domain is equivalent to convolving the spectrum of the input signal with the window spectrum in the frequency domain, thereby altering the spectrum of the window clipped signal. Thus, the window clipping process fails to adequately address the problems of the hard clipping processes.

SUMMARY OF THE INVENTION

The present invention reduces signal peaks by notching the peak of a signal above a threshold to produce a notched signal. The notched signal is then filtered to produce a resulting signal with a reduced peak amplitude. For example, in an implementation where the signal is represented by signal samples, the peak notching system first locates a peak sample that is beyond a threshold, such as a sample representing a positive peak sample of a peak above the threshold. Once a peak sample is located, the peak notching system adjusts the peak sample by an amount which is a function of the amount that the peak sample is beyond the threshold, effectively creating a notched signal with a one sample notch at the peak. The peak notching system filters the notched signal to fill in the notch to produce a signal with a reduced peak.

BRIEF DESCRIPTION OF THE DRAWINGS

Other aspects and advantages of the present invention may become apparent upon reading the following detailed description and upon reference to the drawings in which.

DETAILED DESCRIPTION

Figure 1A:
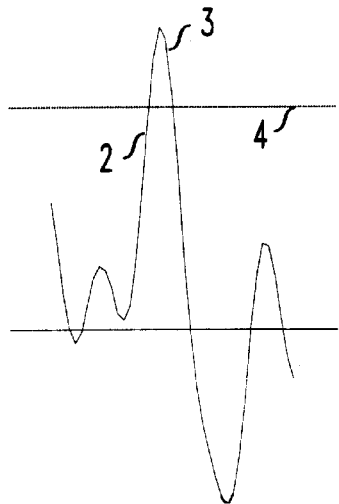
FIGS. 1A–F show the operating of a hardlimiting process to reduce the PAR of an example waveform.
Figure 1B:
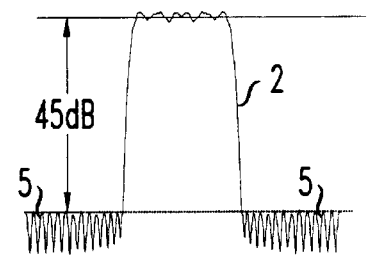
Figure 1C:
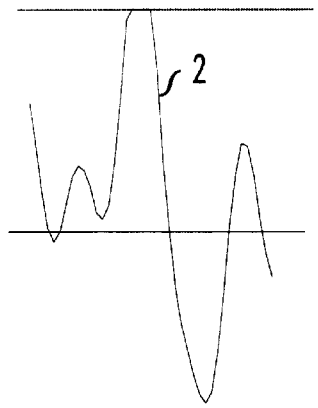
Figure 1D:
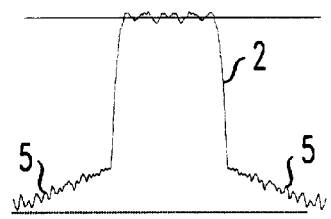
Figure 1E:
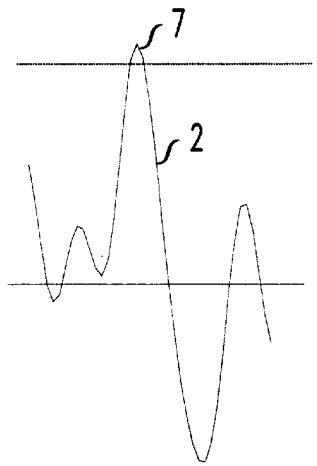
Figure 1F:
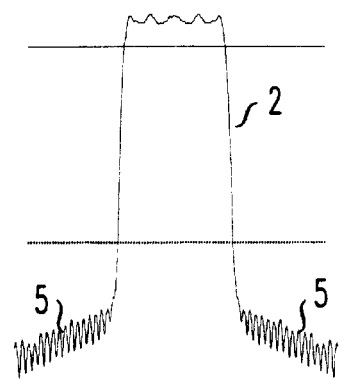

FIG. 1A shows an example baseband in-phase waveform 2, such as a 1.25 MHz CDMA carrier, in the time domain with a peak 3 above a threshold 4, and FIG. 1B shows the corresponding spectral representation with the ACP 5 being 45 dB below the signal 2. FIG. 1C illustrates how the hard limiting procedure clips the signal 2, and FIG. 1D shows the corresponding effect or increase in the ACP 5 on the signal spectrum for a single carrier IS-95 system. However, after the clipped signal 2 is filtered to reduce the ACP 5 as shown in FIG. 1F, the peaks 7 grow back as shown in FIG. 1E. For example, if the limiting threshold is set at 8.5 dB above the average power, the resulting PAR is 9.5 dB after the filtering. In order to arrive at a PAR of 8.5 dB, the threshold has to be set to about 1.5 dB below the target, causing a large number of peaks that are below the targeted maximum to be clipped.

Figure 2A:
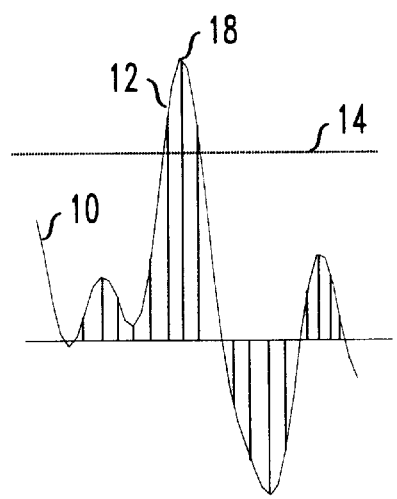
FIGS. 2A–F show the operation of the peak notching system according to the principles of the present invention to reduce the peak of an example waveform.
Figure 2B:
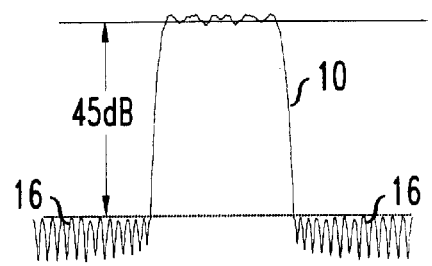
Figure 2C:
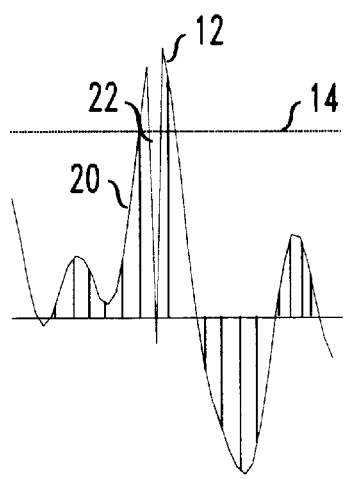
Figure 2D:
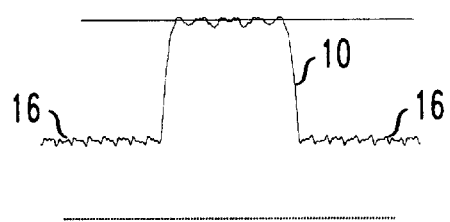
Figure 2E:
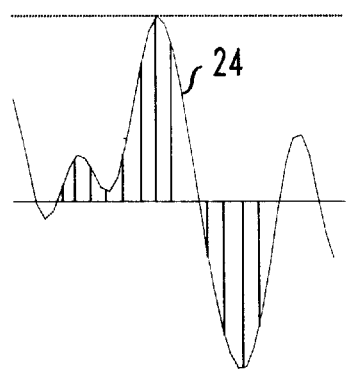
Figure 2F:
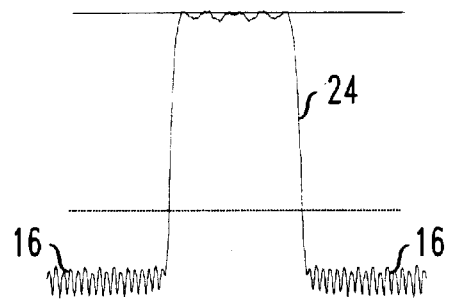

An illustrative embodiment of a peak notching system according to the principles of the present invention is described below which uses a simple and low-cost system to produce a signal with a reduced PAR while removing the adjacent channel power and spectral regrowth from the signal. FIG. 2A shows a signal 10 to be amplified, and the signal 10 is shown in the time domain with a peak 12 having an amplitude (for example voltage) above a threshold 14. FIG. 2B shows the signal 10 in the frequency domain, such as a 1.25 MHz carrier which is 45 dB above adjacent channel power 16. The signal 10 is shown as an analog signal, but it should be understood that the peak notching system can sample the signal 10 to obtain signal samples, shown as lines within the envelope of the signal 10, which are used to represent the signal 10. In this embodiment, the peak notching system locates a peak sample 18 representing the maximum of the peak 12 above the threshold 14. The peak notching system in this embodiment adjusts the amplitude (for example, the voltage) of the peak sample 18 by an amount which is a function of the amount that the peak sample exceeds the threshold, effectively creating a notched signal 20 in the time domain with a one-sample notch 22 at the top of the peak 12 as shown in FIG. 2C. In the frequency domain shown in FIG. 2D, the adjacent channel power 16 increases due to the notching of the signal 10 to produce the notched signal 20. The notching of the signal 10 reduces the in-band power or energy of the signal and increases the out-of-band power or energy. To reduce the adjacent channel power and bring the reduced peak sample 18 to the threshold 14, the notched signal 20 is filtered to fill in the notch and produce a signal 24 shown with a reduced PAR as shown in FIG. 2E and with reduced adjacent channel power as shown in FIG. 2F. The filter reduces the power or energy outside the band and passes or retains the in-band power or energy. As such, by filtering the notched signal, the out-of band power produced by the notching is removed, and the resulting signal has an amplitude adjusted by an amount depending on the amount that the original peak sample is beyond the threshold.

As mentioned above, the amount by which the peak sample is adjusted is a function of the amount that the peak sample exceeds the threshold. Depending on the embodiment, the amount that the peak sample is reduced can be determined as a function of the amount that the peak sample exceeds the threshold and a scaling factor. In this embodiment, the scaling factor is dependent on the oversampling ratio. The sampling rate is the rate at which the signal is sampled. If a waveform is sampled at twice the highest frequency sine wave component, then the original signal can be reconstructed from the sample points. As such, the minimum sampling rate would be 2 times the frequency of the signal. The oversampling ratio can be determined by the this embodiment, a sampling rate of 8 times the frequency of the signal is performed which provides an oversampling ratio of 4. For an oversampling ratio of 4, the scaling factor is approximately 4. If a greater oversampling ratio is used, the scaling factor would increase, and if the oversampling ratio decreases, the scaling factor decreases. In this embodiment, with an oversampling ratio of 4, an adjustment value equal to about 4 X the amount that the peak sample is above the threshold is subtracted from the peak sample to produce a notched signal. If the peak sample has a negative polarity, the adjustment value is added to the peak sample. Other embodiments are possible using different scaling factors to determine the adjustment value or using an adjustment value determined in a different manner to reduce the peak sample in different ways.

Figure 3:
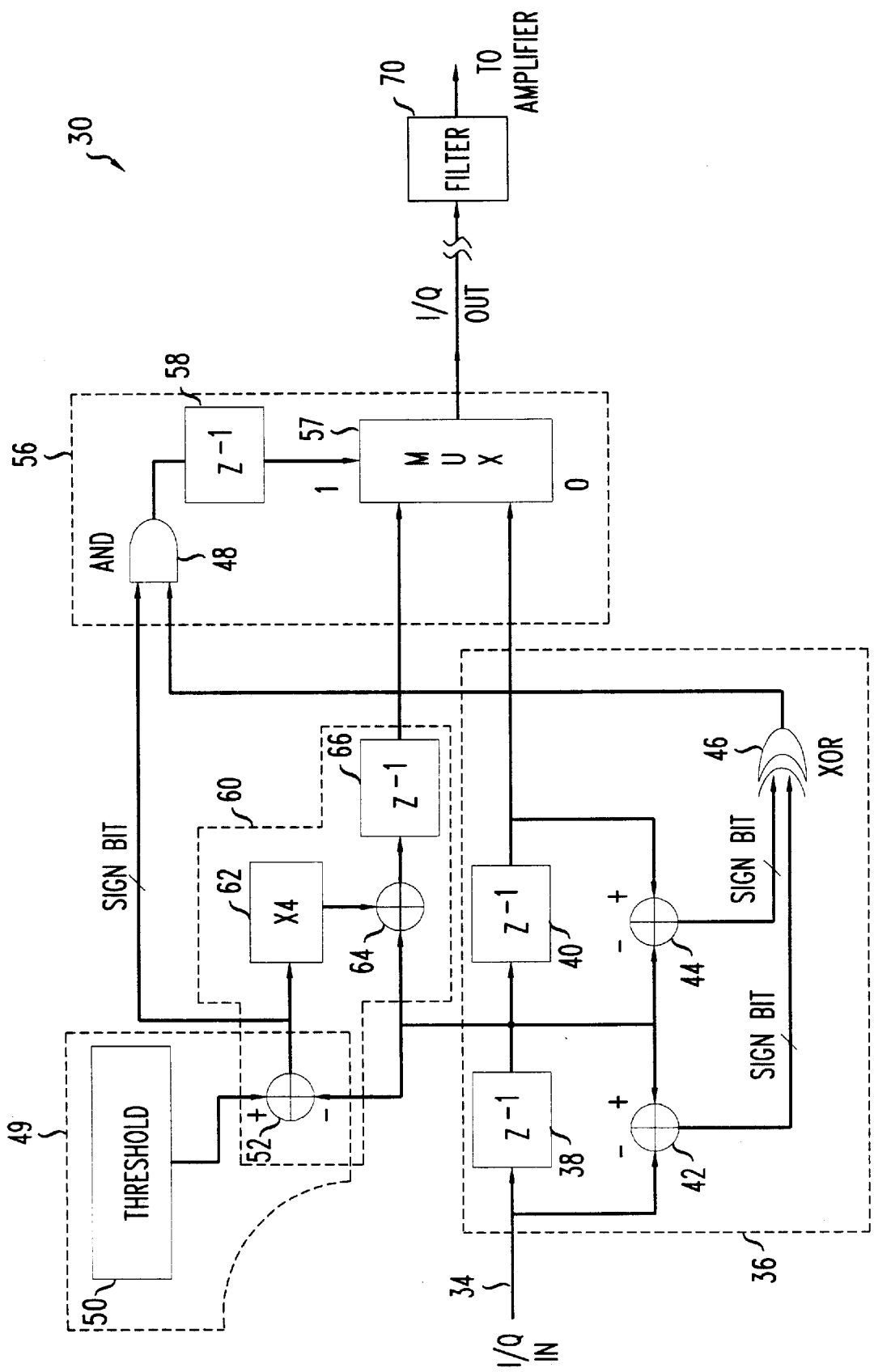
FIG. 3 shows a general block diagram of a peak notching system according to the principles of the present invention.

FIG. 3 shows an embodiment of a peak notching system 30 for notching positive peaks of a signal on a signal path 34. In this embodiment, the peak notching system 30 locates a peak sample (such as a positive or negative peak sample) in the digital domain using a peak sample location circuitry 36. In this embodiment, the peak sample location circuitry 36 includes a first delay 38 and a second delay 40 on the signal path 34. To locate a peak sample, the sample at the output of the first delay 38 or the potential peak sample is compared with the preceding sample at the output of the second delay 40 and with the following sample at the input of the delay 38. In this embodiment, a summer 42 subtracts the following sample at the input to the delay 38 from the sample at the output of the delay 38. If the result is negative, then the following sample is greater than the sample at the output of the delay 38. If the result is positive, then the following sample is less than the sample at the output of the delay 38. A summer 44 subtracts the sample at the output of the delay 38 from the preceding sample at the output of the delay 40. If the result is negative, the sample at the output of the delay 38 is greater than the sample at the output of the delay 40. If the result is positive, the sample at the output of the delay 38 is less than the sample at the output of the delay 40.

A peak sample is located by comparing the sample at the output of the delay 38 with the preceding and following samples. If the following sample at the input to the delay 38 is less than the potential peak sample at the output of the delay 38 and the potential peak sample is greater than the preceding sample at the output of the delay 40, the potential peak sample is a positive peak sample. If the following sample at the input to the delay 38 is greater than the potential peak sample and the potential peak sample is less than the preceding sample at the output of the delay 40, the potential peak sample is a negative peak sample. The sign bits resulting from the operations of the summers 42 and 44 are provided to an XOR gate 46. If the potential peak sample is a positive peak sample or a negative peak sample (such as a local maximum or minimum), the XOR gate should produce a logic "1" because the sign bits will indicate that the peak sample is either less than both the preceding and following samples or greater than both the preceding and following samples. Otherwise, if the sample is not a positive peak sample or a negative peak sample, the XOR gate 46 should produce a logic "0". The output of the XOR gate indicating whether a peak sample has been located is supplied to an AND gate 48.

In this embodiment, the peak notching system 30 includes threshold detection circuitry 49 to detect whether the potential peak sample is above a threshold, indicating a positive peak. In limiting negative peaks, similar circuitry (not shown) for detecting whether a sample is below a negative threshold would be used along with additional circuitry to adjust a negative peak sample below the negative threshold to be above the threshold as would be understood by one of skill in the art with the benefit of this disclosure. In this embodiment, the output of the delay 38 is compared to a threshold 50. For example, the sample at the output of the delay 38 can be subtracted from the threshold 50 by an adder 52. If the threshold value is greater than the sample value at the output of the delay 38, the sample value is not located above the threshold, and the resulting sign bit is a logic "0" which is provided to the AND gate 48. If the threshold value is less than the sample at the output of the delay 38, the potential peak sample is located above the threshold, and the summer 52 produces a negative value. The negative sign bit which is a logic "1" is provided to the AND gate 48.

In this embodiment, if either the adder 52 produces a "0" (indicating a sample below the threshold) or the XOR gate 46 produces a logic "0" (sample at output of the delay 38 not a peak sample), the AND gate 48 produces a zero (indicating not a positive peak sample). As such, switching or adjusting circuitry 56 provides the sample at the output of the delay 38 as an output without the sample being altered or replaced. In this embodiment, the output from the AND gate 48 controls a multiplexer 57. If the AND gate produces a "0," the multiplexer 57 provides the sample at the output of the delay 38 as an output to the multiplexer 57 without the sample being altered or replaced by the shown circuitry of the system 30. The sample at the output of the delay 38 is produced after passing through the delay 40. A delay 58 delays the control signal from the AND gate 48 by an amount corresponding to the delay 40, so the sample at the output of the delay 38 is received by the multiplexer 57 at the time the signal from the AND gate 48 is received by the multiplexer 57. As such, the multiplexer 57 produces the appropriate sample value at the appropriate time.

If the sample at the output of the delay 38 is a positive peak sample, the peak notching system 30 notches the peak by adjusting the positive peak sample by an adjustment value. In this embodiment, if the output of the XOR gate 46 is a one (indicating a peak sample) and the sign bit from the output of the summer 52 is a one (indicating a sample above the threshold), the sample at the output of the delay 3 8 is a positive peak sample. As such, the switching or adjusting circuitry 56 provides an adjusted sample instead of the positive peak sample. In this embodiment, if the AND gate 48 produces a "1," the multiplexer 57 switches in an adjusted or reduced positive peak sample from adjustment or adjusted sample circuitry 60. The adjustment circuitry 60 receives the sample at the output of the delay 38. In this embodiment, the adder 52 receives the sample and provides the difference between the sample value and the threshold to a multiplier 62. The multiplier 62 calculates an adjustment value, for example 4 times the difference between the sample and the threshold. The sample is also provided to an adder 64 which subtracts the adjustment value from the sample to produce a reduced sample. If the sample is a positive peak sample, the reduced sample from the adjustment circuitry 60 is produced to replace the positive peak sample at the output of the delay 38 after passing through a delay 66. The delay 66 delays the reduced sample by an amount corresponding to the delay 40 and the delay 58. As such, the reduced sample is received by the multiplexer 57 at the same time as the corresponding control signal from the AND gate 48 and the corresponding positive peak sample from the output of the delay 38.

By switching in the reduced sample to the signal path, a notched signal is produced. The notching of the signal increases the adjacent channel power, but a downstream filter 70 can reduce the adjacent channel power while passing the in-band power. As such, the notch is filled in to produce a signal with reduced adjacent channel power and a reduced peak to average power ratio because the peak of the resulting signal has an amplitude reduced by an amount which is a function of the amount that the peak sample is reduced. The filter can be a finite impulse response filter (FIR) filter operated in the digital domain or in the analog domain after the signal has been digital-to-analog converted. The peak notching system 30 is simple and cost effective, for example requiring a very small amount of space on a field programmable gate array (FPGA).

Figure 4:
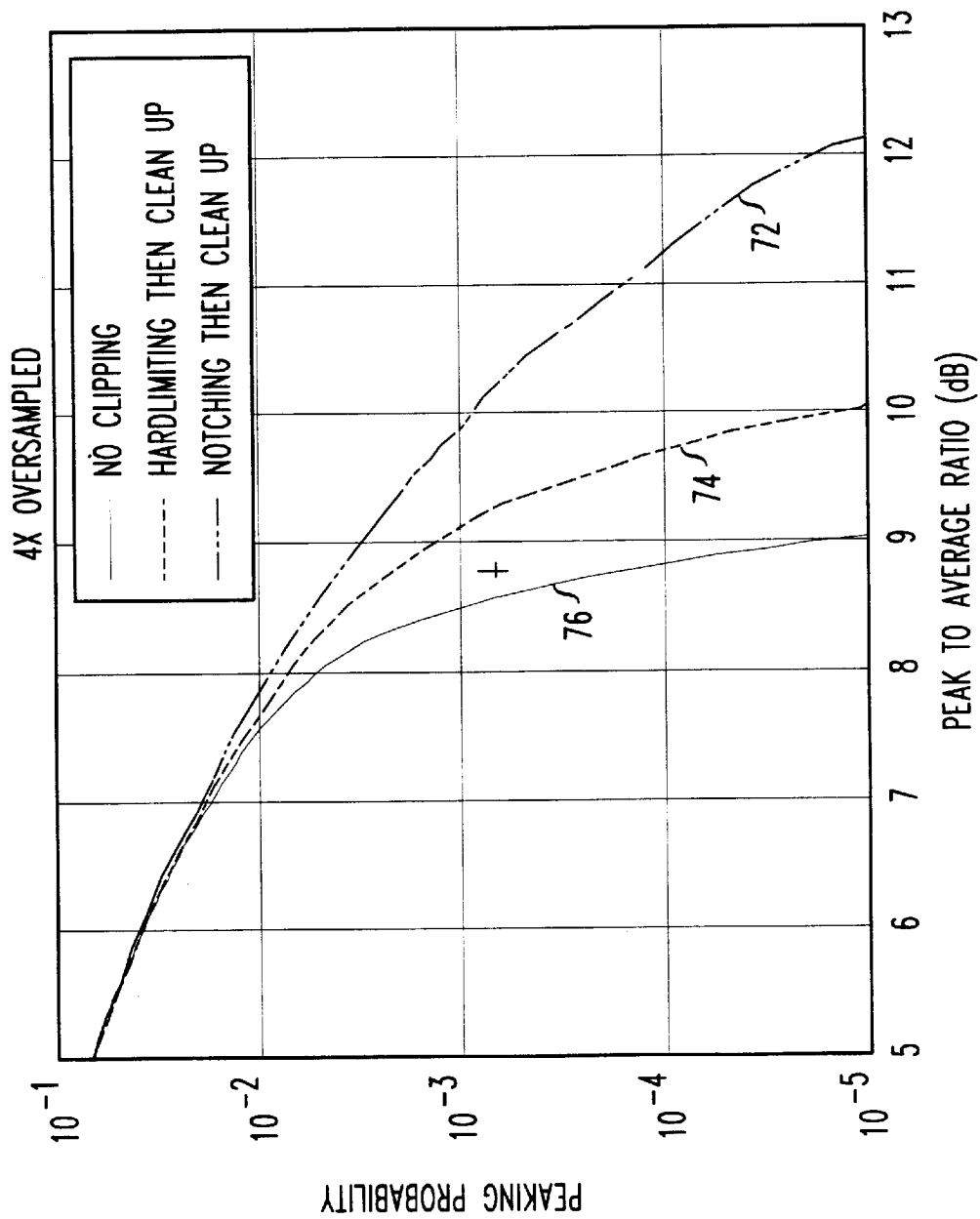
FIG. 4 shows a graphical representation of a comparison of different techniques for reducing the PAR of a signal.

FIG. 4 shows the results of simulations of different peak limiting scenarios comparing the peak to average power ratios (PAR) vs. peaking probability for a loaded single 1.25 MHz CDMA carrier, assuming a pilot with 40 other active walsh channels. The threshold was set at 8.5 dB above the average power, and the peaking probability is the probability that a peak will exceed the threshold. For example, a peaking probability of $10^{-4}$ means that on average one in 10000 peaks will exceed the threshold. The plot 72 shows the PAR of the signal at about 11.3 dB measured at $10^{-4}$ peaking probability. The plot 74 shows the PAR for the resulting signal in which peaks above the threshold are hardlimited to the threshold value then filtered. At $10^{-4}$ peaking probability, the resulting signal experiences about 1.2 dB of peak regrowth after filtering. In this embodiment, hardlimiting was performed at 4X oversampling rate then filter with a cleanup filter. Plot 76 shows the results of the peak notching system which only exhibits about 0.3 dB of peak regrowth after the cleanup filtering at a peaking probability of $10^{-4}$. The performance degrades if the sampling rate is reduced to 2X. The reason is because the peaks are more likely to grow back in between the samples with the increased time span. At 2X sampling rate, the peak-notching algorithm has a peak regrowth of about 0.9 dB, approaching that of simple hardlimiting.

In addition to the embodiment described above, alternative configurations of the peak notching system according to the principles of the present invention are possible which omit and/or add components and/or use variations or portions of the described system. For example, for notching signals of positive and negative peaks, an embodiment could use two (2) such systems 30 or at least 2 sets, variations or portions of the described system 30 as would be understood by one skilled in the art to adjust positive or negative peaks beyond a threshold. The signal on the signal path 34 can be a stream of so-called in-phase (I) or quadrature (Q) digital signal samples.

To adjust positive and negative peaks of both I and Q signals, an embodiment could se four (4) such systems 30 or at least 4 sets, variations or portions of the described system 30 as would be understood by one skilled in the art. Furthermore, instead of using switching circuitry 56 to replace the peak sample with an adjusted sample, adjustment or adjusting circuitry could directly adjust the peak sample on the signal path beyond the threshold to within the threshold or by a desired amount which is a function of the amount that the peak sample is reduced. Additionally, the embodiment of the peak notching system has been described as being used to reduce the PAR of a CDMA 1.25 MHz carrier, but the peak notching system can be used to improve the PAR of other signals. The peak notching system has been described as producing a one sample adjustment, or notch, in the signal. A notch of multiple samples is possible which occurs when the adjusted or notched samples are adjusted to below adjacent samples. Depending on the embodiment, the peak notching system can be used with filters having different responses.

The system has been described as using a particular configuration of components, but other devices or arrangements can be used as well which perform the same functions. For example, the peak notching system can be used on digital or analog signals using digital and/or analog components. The peak notching system has been further described as using different configurations of particular components, but it should be understood that the peak notching system and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method for use in a communications system including a signal to be amplified, said method comprising:

locating a peak sample of said signal above a threshold;

adjusting said peak sample of said signal by an amount which is a function of the difference between said threshold and said peak sample and an oversampling factor to produce an adjusted sample.

replacing said peak sample with said adjusted sample within said threshold to produce a notched signal having a notch; and filtering said notched signal to remove said notch and to produce a resulting signal having a reduced peak amplitude compared to said signal.

2. The method of claim 1 wherein said locating includes:

determining whether a sample of said signal is a positive peak sample or a negative peak sample; and comparing said sample with said threshold.

3. The method of claim 2 wherein said determining includes:

comparing said sample with a preceding sample and a following sample of said signal.

4. A system for limiting the peak of a signal to be amplified, said system comprises:

notching circuitry including peak sample locating circuitry configured to locate a peak sample of said signal above a threshold, said peak sample locating circuitry having a first delay coupled to a second delay, said first delay configured to receive a preceding sample while producing a sample, said second delay configured to receive said sample while producing a following sample said peak sample locating circuitry configured to determine whether said sample is said peak sample by comparing said sample with said preceding sample and said following sample; threshold detection circuitry configured to determine if said sample is above said threshold; and adjustment circuitry configured to respond to said sample to determine an adjustment value and to adjust said peak sample of said signal by said adjustment value to produce an adjusted sample within said threshold to produce a notched signal having a notch; and a filter configured to filter said notched signal to remove said notch and to produce a signal having a reduced peak amplitude compared to said signal to be amplified.

5. The system of claim 4 wherein said notching circuitry further including:

switching circuitry responsive to whether said sample is said peak sample and beyond said threshold to replace said sample with said adjusted sample.

* * * * *